(12) United States Patent
Chhabra et al.

(10) Patent No.: US 9,396,790 B1
(45) Date of Patent: Jul. 19, 2016

(54) MULTI-SUPPLY DUAL PORT REGISTER FILE

(71) Applicant: STMicroelectronics International N.V., Schiphol (NL)

(72) Inventors: Amit Chhabra, Delhi (IN); Kailash Digari, Greater Noida (IN)

(73) Assignee: STMICROELECTRONICS INTERNATIONAL N.V., Schiphol (NL)

( * ) Notice: Subject to any disclaimer, the term of this patent is extended or adjusted under 35 U.S.C. 154(b) by 0 days.

(21) Appl. No.: 14/755,362

(22) Filed: Jun. 30, 2015

(51) Int. Cl.
*G11C 11/41* (2006.01)
*G11C 11/419* (2006.01)

(52) U.S. Cl.
CPC .................... *G11C 11/419* (2013.01)

(58) Field of Classification Search
CPC ..................................... G11C 11/419
USPC .......................................... 365/72
See application file for complete search history.

(56) References Cited

U.S. PATENT DOCUMENTS

| | | | | |
|---|---|---|---|---|
| 7,839,697 B2* | 11/2010 | Ishikura | .................. | G11C 7/065 365/154 |
| 2015/0009751 A1* | 1/2015 | Kulkarni | ................ | G11C 5/145 365/156 |
| 2015/0085587 A1* | 3/2015 | Vallapaneni | ......... | G11C 11/419 365/189.02 |
| 2015/0279438 A1* | 10/2015 | Kulkarni | .................. | G11C 7/12 365/96 |

OTHER PUBLICATIONS

Bhargava, M., et al., "Low VMIN 20nm Embedded SRAM with Multi-voltage Wordline Control based Read and Write Assist Techniques," VLSI Circuits Digest of Technical Papers, 2014 Symposium, Jun. 10-14, 2014, Honolulu, HI, pp. 1-2.
Calhoun, B., et al., "A 256kb Sub-threshold SRAM in 65nm CMOS," 2006 IEEE International Solid-State Circuits Conference, pp. 628-629, 678.
Chang, I., et al., "A 32 kb 10T Sub-Threshold SRAM Array With Bit-Interleaving and Differential Read Scheme in 90 nm CMOS," IEEE Journal of Solid-state Circuits, vol. 44, No. 2, Feb. 2009, pp. 650-658.
Chang, M., et al., "A Robust Ultra-Low Power Asynchronous FIFO Memory with Self-Adaptive Power Control," 2008 IEEE International Digital Object Identifier: 10.1109/SOCC.2008.4641505, 2008, pp. 175-178.
Du, W., et al., "An Energy-Efficient 10T SRAM-based FIFO Memory Operating in Near-/SubThreshold Regions," IEEE SOC Conference, Sep. 26-28, 2011, IEEE International, Taipei, pp. 19-23.

(Continued)

*Primary Examiner* — Hoai V Ho
*Assistant Examiner* — Tri Hoang
(74) *Attorney, Agent, or Firm* — Seed IP Law Group PLLC

(57) ABSTRACT

A multi-supply dual port register file is disclosed. The register file may be used for transferring data between two power domains that operate on different voltages or frequencies. The register file comprises a memory cell that stores the data transferred between the domains. The memory cell may be independently supplied by a reference voltage independent of that of the memory periphery. A write power domain write data to the memory cell in accordance with its operating voltage and frequency and an independent read power domain may read data from the memory cell in accordance with its independent operating voltage and frequency. The register file facilitates efficient crossing between the read and write power domains.

20 Claims, 3 Drawing Sheets

(56) References Cited

OTHER PUBLICATIONS

Elrabaa, M., "A New FIFO design Enabling Fully-Synchronous On-Chip Data Communication Network," Electronics, Communications and Photonics Conference (SIECPC), 2011 Saudi International Digital Object Identifier: 10.1109/SIECPC.2011.5877006, 2011, pp. 1-6.

Gholipour, M., et al., "An Efficient Asynchronous Pipeline FIFO for Low-Power Applications," Circuits and Systems, 2002, MWSCAS-2002; The 2002 45th Midwest Symposium on Volume: 2 Digital Object Identifier: 10.1109/MWSCAS.2002.1186903, 2002, pp. II-481-II-484.

Kim, T., et al., "A 0.2 V, 480 kb Subthreshold SRAM With 1 k Cells per Bitline for Ultra-LowVoltage Computing," IEEE Journal of Solid-state Circuits, vol. 43, No. 2, Feb. 2008, pp. 518-529.

Ogras, U., et al., "Design and Management of Voltage-Frequency Island Partitioned Networks-on-Chip," IEEE Transactions on Very Large Scale Integration (VLSI) Systems, vol. 17, No. 3, Mar. 2009, pp. 330-341.

Park, S., et al., "Column-Selection-Enabled 8T SRAM array with ~1R/1W Multi-Port Operation for DVFS-Enabled Processors," IEEE Low Power Electronics and Design (ISLPED) 2011 International Symposium, Aug. 1-3, 2011, Fukuoka, pp. 303-308.

Salhiene, M., et al., "Dynamic Voltage Scheduling for Real Time Asynchronous Systems," PATMOS 2002, LNCS 2451, 2002, pp. 390-399.

Sil, A., et al., "Highly Stable, Dual-Port, Sub-threshold 7T SRAM Cell for Ultra-low Power Application," New Circuits and Systems Conference (NEWCAS), 2012 IEEE 10th International Digital Object Identifier: 10.1109/NEWCAS.2012.6329094, pp. 493-496.

Verma, N., et al., "A 256 kb 65 nm 8T Subthreshold SRAM Employing Sense-Amplifier Redundancy," IEEE Journal of Solid-state Circuits, vol. 43, No. 1, Jan. 2008, pp. 141-149.

Yang, H., et al., "A Controllable Low-Power Dual-Port Embedded SRAM for DSP Processor," Memory Technology, Design and Testing, 2007. MTDT 2007. IEEE International Workshop, Dec. 3-5, 2007, IEEE, Taipei, pp. 27-30.

\* cited by examiner

MULTI-SUPPLY DUAL PORT REGISTER FILE

BACKGROUND

1. Technical Field

The present disclosure is related to a multi-supply dual port register file and, in particular, a multi-supply dual port register file adapted for first input first output (FIFO) use between different power domains.

2. Description of the Related Art

FIG. 1 shows a diagram of two domains 10, 12 coupled via an interface 14. Each domain 10, 12 may comprise electronic circuitry, which may be analog or digital circuitry. For example, the first domain 10 may be a processor, whereas the second domain 12 may be a system-on-chip (SoC) that is built around the processor and designed to work with the processor. The two domains 10, 12 may operate at different voltage levels. For example, the first domain may operate at a voltage level of 0.7 volts (V), whereas the second domain may operate at a voltage level of 0.8V. In addition, the two domains 10, 12 may operate at different frequencies. For example, the first domain 10 as a processor domain may operate at a higher frequency of 1.5 gigahertz (GHz), whereas the second domain, which is the SoC may operate at a lower frequency of 500 megahertz (MHz). Furthermore, the first domain 10 and the second domain 12 may be in different power domains. The first and second domain 10, 12 may be in different power domains if they can each be 10, 12 selectively switched off or if the supply voltage of one domain 10, 12 is not connected (or shorted) with the supply voltage of the other domain 10, 12. Accordingly, the two domains 10, 12 may be supplied with the same voltage level but remain as two independent power domains.

As shown in FIG. 1, the domains 10, 12 are each coupled to the interface 14. The interface 14, which is bidirectional comprises a first unidirectional interface 14a and a second unidirectional interface 14b. Although the bidirectional interface is shown in FIG. 1, any unidirectional interface 14a,b may alternatively be used. The interface 14 may be used for transferring data between the domains 10, 12. The bidirectional interface 14 or the unidirectional interfaces 14a,b may be a register file, such as a dual-port register file, a bridge or a first-in first-out (FIFO queue), among others. The first domain 10 may supply data to the first unidirectional interface 14a (for example, by writing data to the interface 14a) and the second domain 12 may read the data from the interface 14a. The interface 14a may enable voltage, clock or power domain crossing, whereby data of the first domain 10, which operates at a different voltage or clock frequency than the second domain 12 or is in a different power domain than the second domain 12, may be supplied to the second domain 12 and vice-versa. The interface 14a may accordingly facilitate domain crossing between voltage, clock or power domains.

FIG. 2 shows a diagram of the two domains 10, 12 electrically coupled via an interface 14a. The interface 14a comprises a plurality of data elements 16a-d (collectively referred to herein by the numeral alone), a multiplexer 18, a voltage level shifting and power isolation unit 20, write control logic 22 and read control logic 23. Data of the first domain 10 is written using write control logic 22 to the interface 14a and read by the second domain 12 from the interface 14a using read control logic 24.

The first domain 10 outputs, to the write control logic 22, data to be sent to the second domain 12. The write control logic 22 provides the data to one or more of the plurality of data elements 16. For example, each data element 16 may be a flip-flop and may receive one bit of data from the write control logic 22 and store the bit. Thereafter, the bits stored by the plurality of data elements 16 are outputted to the multiplexer. It is noted that although a plurality of data elements 116 are shown in FIG. 2, only one data element may be used. The write control logic 22 may also receive a read pointer signal 26 from the read control logic 24 and send a write pointer signal 28 to the read control logic 24. The read pointer signal 26 and the write pointer signal 28 may be used to synchronize a timing of data reading and writing and/or to indicate placement of an ordering of the storage of the bits in one of the plurality data elements 16.

The read control logic 24 outputs a selection signal 30 to the multiplexer 18. Based on the selection signal 30, the multiplexer 18 outputs a selected data bit from a data element 16 to the voltage level shifter and power isolation unit 20. The voltage level shifter and power isolation unit 20 modifies the voltage level of the selected data bits to be compliant with that of the second domain 12. For example, if the voltage level of the first domain is 0.7V whereas the voltage level of the second domain 12 is 0.8V, the voltage level shifter and power isolation unit 20 outputs a voltage level-modified data bit to the second domain 12. Continuing with the example, the voltage level of the outputted data bit is 0.8V and in accordance with the second domain 12. Level shifting slows the operation of the interface 14 and introduces delay in the data transfer between the two domains 10, 12.

It is noted that shifting the voltage level of the data from a voltage level of the first domain 10 to a voltage level of the second domain 12 increases the latency of the data transfer through the interface 14a. In alternative implementations, the voltage level shifter and power isolation unit 20 may be in the data path between the plurality of data elements 16 and the multiplexer 18. However, that results in increasing the size of the interface 14a circuitry due to the fact that a plurality of data bits are each voltage level-shifted prior to being provided to the multiplexer 18.

It is desirable to have an interface that provides efficient data transfer between isolated power domains, such as power domains that operate at different voltages or frequencies.

BRIEF SUMMARY

A dual port register file for transferring data between a first domain (a write domain) and a second domain (a read domain) is disclosed. The write domain may include electrical circuitry that operates at a specified voltage and frequency and may be electrically isolated from the read domain, which may operate at a different voltage and frequency. The dual port register file enables frequency and voltage cross-over, whereby data is trafficked over the dual port register file between the two domains operating at different frequencies and voltages/power domains. The dual port register file enables efficient transfer of data without a dedicated voltage level shifter, power isolation or frequency synchronization.

The dual register file includes a memory cell that is electrically coupled to the write domain and the read domain. The memory cell is used to store data trafficked between the two domains. The memory cell has a number of write domain electrical nodes. The write domain electrical nodes are electrically connected to the write domain. To write data to the memory cell, the write domain supplies voltages to the electrical nodes. The supplied voltages have levels that are in accordance with the operating voltage of the write domain. Similarly, the memory cell has a number of read domain electrical nodes that are electrically coupled to the read domain. To read data to the memory cell, the read domain supplies voltages to the electrical nodes, whereby the supplied voltages have levels in accordance with the operating voltage of the read domain.

DETAILED DESCRIPTION

Figure 1:
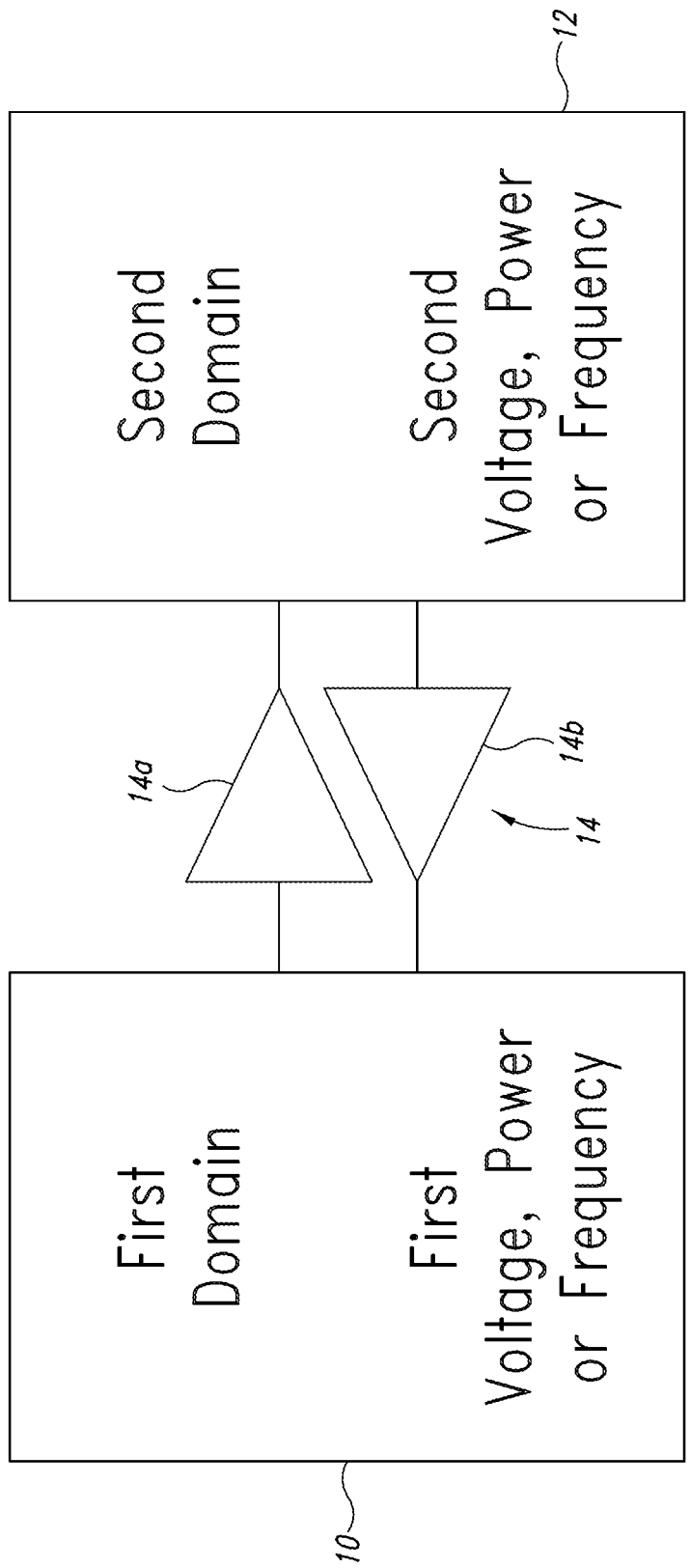
FIG. 1 shows a diagram of two domains coupled via an interface.
Figure 2:
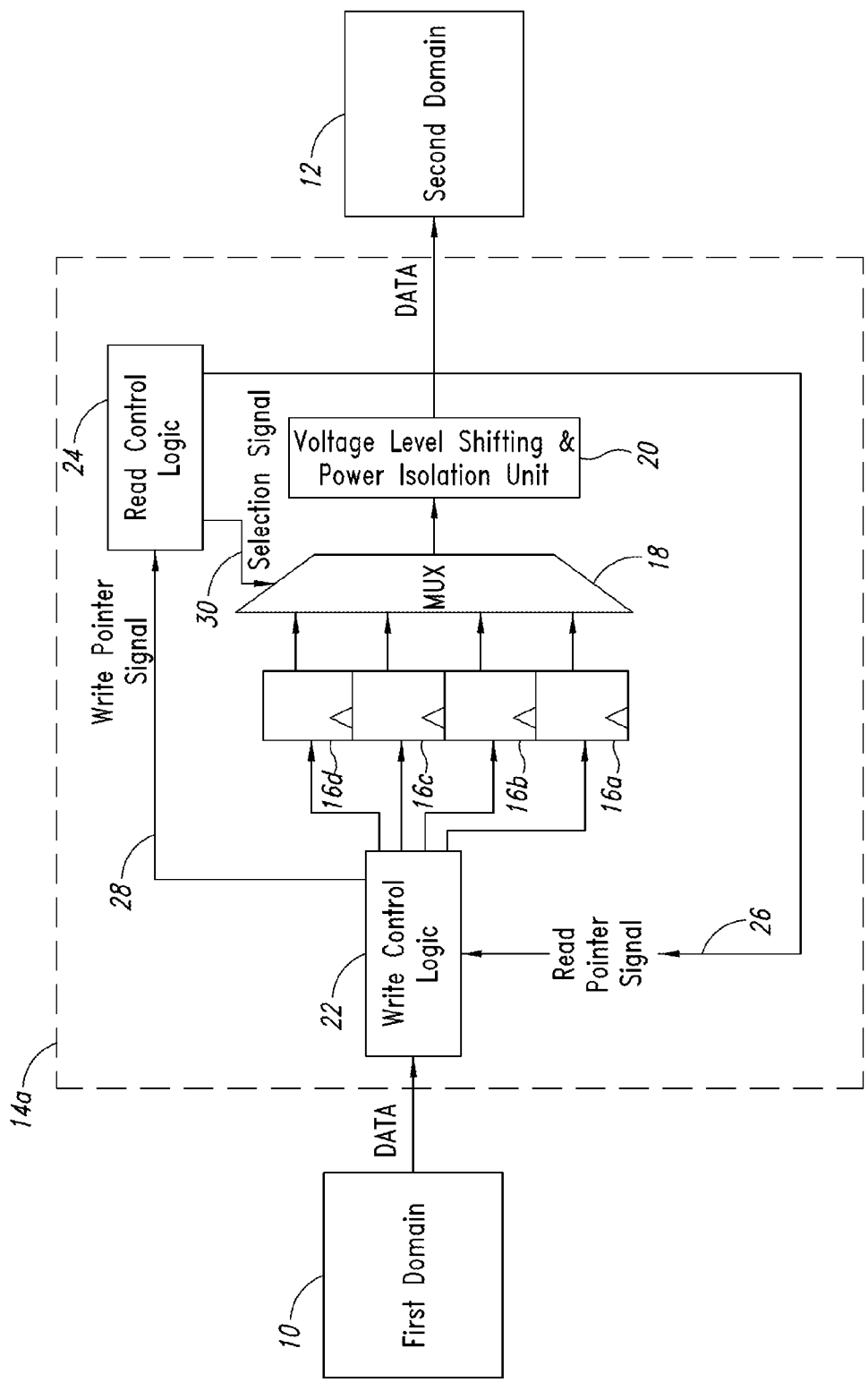
FIG. 2 shows a diagram of the two domains coupled via an interface.
Figure 3:
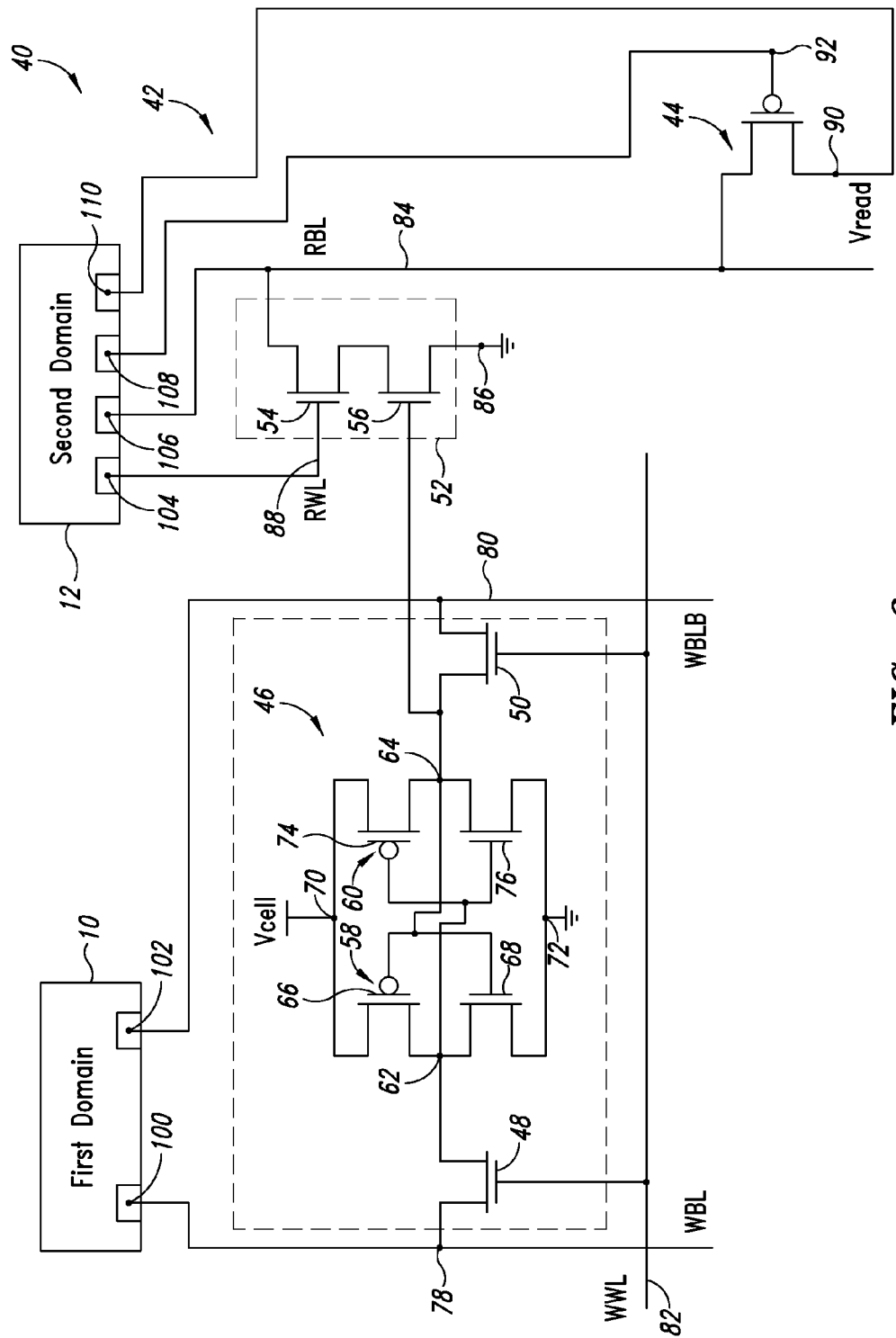
FIG. 3 shows a circuit schematic of a dual-port register file.

FIG. 3 shows a circuit schematic of a dual-port register file 40. The dual-port register file 40 comprises an eight-transistor (8-T) bit cell 42 and a pre-charge transistor 44 that are electrically coupled. The 8-T bit cell 42 comprises a four-transistor (4-T) static memory cell 46 (hereinafter memory cell 46), a first write access transistor 48, a second write access transistor 50 and a read port 52 comprising a first read transistor 54 and a second read transistor 56 that are in stack.

The memory cell 46 comprises a first inverter 58 and a second inverter 60 that are cross-coupled. FIG. 3 shows the configuration of the internal transistors of the cross-coupled inverters 58, 60. The first inverter 58 comprises a p-channel transistor 66 and an n-channel transistor 68. The gates of the p-channel transistor 66 and the n-channel transistor 68 are electrically coupled to a second node 64 of the memory cell 46. The drain of the n-channel transistor 68 and the drain of the p-channel transistor 66 are electrically coupled to a first node 62 of the memory cell 46. The source of the p-channel transistor 66 is electrically coupled to a memory cell reference voltage node 70 and the source of the n-channel transistor 68 is electrically coupled to an array grounding node 72.

The second inverter 60 also comprises a p-channel transistor 74 and an n-channel transistor 76. The gates of the p-channel transistor 74 and the n-channel transistor 76 are both electrically coupled to the first node 62 of the memory cell 46. The drain of the n-channel transistor 76 and the drain of the p-channel transistor 74 are electrically coupled to the second node 64 of the memory cell 46. The source of the p-channel transistor 74 is electrically coupled to the memory cell reference voltage node 70, whereas the source of the n-channel transistor 76 is electrically coupled to the array grounding node 72.

The source terminal of the first write access transistor 48 is electrically coupled to a write bit line (WBL) 78, and the drain terminal of the first write access transistor 48 is electrically coupled to the first node 62 of the static memory cell 46. Furthermore, the source terminal of the second write access transistor 50 is electrically coupled to a complementary write bit line (WBLB) 80, and the drain terminal of the second write access transistor 50 is electrically coupled to the second node 64 of the static memory cell 46. The gate terminals of the write access transistors 48, 50 are respectively electrically coupled to a write word line (WWL) 82 that enables writing data to the static memory cell 46.

The drain of the first read transistor 54 is electrically coupled to a read bit line (RBL) 84 and the source of the first read transistor 54 is electrically coupled to the drain of the second read transistor 56. The source of the second read transistor 56, on the other hand, is connected to a read port ground terminal 86. The gate of the first read transistor 54 is electrically coupled to a read word line (RWL) 88 and the gate of the second read transistor 56 is electrically coupled to the second node 64 of the memory cell 46.

The pre-charge transistor 44, which is a p-channel transistor, is electrically coupled, at its drain, to the RBL 84. The source of the pre-charge transistor 44 is electrically coupled to a sensing node 90 used to sense the voltage of the RBL 84. The gate of the pre-charge transistor 44 is electrically coupled to a gate drive node 92.

The WBL 78 and the WBLB 80 are each electrically coupled to a first power supply node 100 and a second power supply node 102 of the first domain 10, respectively. Furthermore, the RWL 88 and the RBL 84 are each electrically coupled to a first power supply node 104 and a second power supply node 106 of the second domain 12, respectively. In addition, the gate drive node 92 and the sensing node 90 of the pre-charge transistor 44 are each electrically coupled to a third power supply node 108 and a fourth power supply node 110 of the second domain 12, respectively.

The dual-port register file 40 of FIG. 3 is used to enable power domain crossing between the first domain 10 that writes data to the dual-port register file 40 and the second domain 12 that reads data from the dual-port register file 40. The different power domains that write data to the dual-port register file 40 and read data from the dual-port register file 40 are isolated.

Furthermore, the memory cell 46 and the two write access transistors 48, 50 is isolated in a power supply sense from the remainder of the memory periphery. A memory cell reference voltage (Vcell) provided at the memory cell reference voltage node 70 may be higher than the reference voltage of either the first domain 10 or the second domain 12. That is because the memory cell 46 may require a minimum voltage to operate that is higher than that provided by the first domain 10 (the read domain) or the second domain 12 (the write domain). However, the Vcell may also be a third power supply node of the first domain 10.

The WBL 78 and WBLB 80 are both driven by the first power supply node 100 and the second power supply node 102, respectively, of the first domain 10. The voltage level of the WBL 78 or the WBLB 80 whether they are asserted or de-asserted is dictated by the voltage level of the first domain 10 and is in accordance with the voltage level of the first domain 10. In an alternate arrangement, WBL 78 and WBLB 80 can also be coupled with the Vcell supply voltage, while the rest of the memory periphery for write operations is coupled with the first power domain 10.

To write data (i.e., a bit) to the static memory cell 46, the WWL 82 is first asserted. As a result, the first and second write access transistors 48, 50 are switched on thus connecting the first node 62 of the static memory cell 46 to the WBL 78 and connecting the second node 64 of the static memory cell 46 to the WBLB 80. The WBL 78 carries the data that is sought to be written to the static memory cell 46 and is asserted when a logical one is sought to be written and is de-asserted when a logical zero is sought to be written. Conversely, the WBLB 80 is set to be a complement of the WBL 78 and is de-asserted when a logical one is sought to be written and asserted when a logical zero is sought to be written.

For example, if a logical one is to be written to the memory cell 46 and the voltage level of the first domain is 0.7V, the voltage level at the first power supply node 100 is set to 0.7V to assert the WBL 78 and the voltage level at the second power supply node 102 is set to 0V. Because the second node 64 of the memory cell 46 is electrically coupled to the WBLB 80 when the WWL 82 is asserted, the voltage level at the second node 64 will be 0V. Thus, the p-channel transistor 66 of the first inverter 58 is turned on and the voltage level at the first node 62 of the memory cell 46 takes on the Vcell voltage supplied at the memory cell reference voltage node 70. Accordingly, the memory cell 46 will be in a different domain than the first domain 10.

To read the bit stored in the memory cell 46, the voltage level of the first power supply node 104 of the second domain 12 is set to the reference voltage of the second domain 12 thus turning on the first read transistor 54 of the read port 52. Further, the voltage level of the second power supply node 106 is set to the reference voltage of the second domain 12 to pre-charge the RBL 84.

If a logical one is stored in the memory cell 46, the second node 64 of the memory cell 46 is grounded and, accordingly, the second read transistor 56 is switched off. While the second read transistor 56 is switched off, the RBL 84 remains pre-charged at the reference voltage of the second domain 12. When the voltage level of the third power supply node 108 is set to reference voltage of the second domain 12, the pre-charge transistor 44 is switched off and the reference voltage of the second domain 12 is sensed at the fourth power supply node 110. Sensing the reference voltage at the fourth power supply node 110 indicates that a logical one is stored in the memory cell 46.

Conversely, if a logical zero is stored in the memory cell 46, the voltage level at the second node of the memory cell 46 will be the reference voltage (Vcell) of the memory cell 46. Accordingly, the second read transistor 56 of the read port 52 will be switched on and the RBL 84 starts discharging, and will continue to discharges to ground under current scenario. Accordingly, when the voltage level of the third power supply node 108 is set to reference voltage of the second domain 12, the pre-charge transistor 44 is switched off, and a lower voltage level at RBL 84 is sensed at the fourth power supply node 110. Sensing the reduced (using conventional sense amplifier) or zero voltage (using a conventional inverter stage) at the fourth power supply node 110 indicates that a logical zero is stored in the memory cell 46.

The power supply configuration of FIG. 3, ensures that the first domain 10 (read domain) and the second domain 12 (write domain) are isolated and domain cross-over is prevented. The first domain 10 writes data to the memory cell 46 by driving the first power supply node 100 and the second power supply node 102 in accordance with the reference voltage of the first domain 10 and at the operational frequency of the first domain 10. In addition, the second domain 12 reads data from the memory cell 46 by driving the first power supply node 104, second power supply node 106 and third power supply node 108 of the second domain 12 in accordance with the reference voltage of the second domain 12 and at the operational frequency of the second domain 12. Further, the memory cell 46 is in a power domain isolated from the first domain 10 and the second domain 12.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A system comprising:
    a plurality of isolated power domains comprising a memory cell power domain, a write power domain and a read power domain, wherein:
        the memory cell power domain is configured to supply a reference voltage to a memory cell reference voltage node;
        the write power domain is configured to supply voltage to a first write domain node and a second write domain node; and
        the read power domain is configured to supply voltage to a first read domain node, second read domain node and third read domain node and sense voltage at a fourth read domain node;
    a memory cell comprising a first inverter and a second inverter, a first node of the memory cell is electrically coupled to an input node of the second inverter and an output node of the first inverter and a second node of the memory cell is electrically coupled to an input node of the first inverter and an output node of the second inverter, a power supply node of the first inverter and the second inverter being electrically coupled to the memory cell reference voltage node;
    a write bit line electrically coupled to the first write domain node or the reference voltage of the memory cell power domain;
    a complementary write bit line electrically coupled to the second write domain node or the reference voltage of the memory cell power domain;
    a first write access transistor having a source electrically coupled to the first node, a drain electrically coupled to the write bit line and a gate electrically coupled to a write word line;
    a second write access transistor having a source electrically coupled to the second node, a drain electrically coupled to the complementary write bit line and a gate electrically coupled to the write word line;
    a read word line electrically coupled to the first read domain node;
    a read bit line electrically coupled to the second read domain node;
    a read port comprising stacked first and second read transistors, the first read transistor having a source electrically coupled to the read bit line, a drain electrically coupled to a source of the second read transistor, and a gate electrically coupled to the read word line, the second read transistor having a drain electrically coupled to ground and a gate electrically coupled to the second node of the static memory cell; and
    a sense transistor having a gate electrically coupled to the third read domain node, a drain electrically coupled to the fourth read domain node and a source electrically coupled to the read bit line.

2. The system of claim 1 wherein the plurality of isolated power domains are independent of one another and are capable of being selectively switched off.

3. The system of claim 1 wherein a respective plurality of reference voltages of the plurality of isolated power domains are different.

4. The system of claim 1 wherein a respective plurality of clock frequencies of the plurality of isolated power domains are different.

5. The system of claim 1 wherein the write power domain further comprises circuitry configured to write a bit of data to the memory cell by setting a voltage level at the first write domain node to a reference voltage of the write power domain and grounding the second write domain node.

6. The system of claim 1 wherein the write power domain further comprises circuitry configured to write a bit of data to the memory cell by setting a voltage level at the second write domain node to a reference voltage of the write power domain and grounding the first write domain node.

7. The system of claim 1 wherein the read power domain further comprises circuitry configured to initiate reading a bit of data stored in the memory cell by setting a voltage level at the first read domain node and the second read domain node to a reference voltage of the read power domain.

8. The system of claim 7 wherein the circuitry is configured to determine that the bit of data is a logical one if the reference voltage of the read power domain is sensed at the fourth read domain node.

9. The system of claim 7 wherein the circuitry is configured to determine that the bit of data is a logical zero if a voltage lower than the reference voltage of the read power domain is sensed at the fourth read domain node.

10. A dual port register file comprising:
a first write domain node and a second write domain node configured to be supplied by voltage from a write domain;
a first read domain node, a second read domain node and a third read domain node configured to be supplied by voltage from a read domain;
a memory cell reference voltage node configured to be supplied by a memory cell reference voltage;
a memory cell comprising a first inverter and a second inverter, a first node of the memory cell is electrically coupled to both an input node of the second inverter and an output node of the first inverter and a second node of the memory cell is electrically coupled to both an input node of the first inverter and an output node of the second inverter, a power supply node of the first inverter and the second inverter being electrically coupled to the memory cell reference voltage node;
a write bit line electrically coupled to the first write domain node;
a complementary write bit line electrically coupled to the second power write domain node;
a first write access transistor having a source electrically coupled to the first node of the memory cell, a drain electrically coupled to the write bit line and a gate electrically coupled to a write word line;
a second write access transistor having a source electrically coupled to the second node of the memory cell, a drain electrically coupled to the complementary write bit line and a gate electrically coupled to the write word line;
a read word line electrically coupled to the first read domain node;
a read bit line electrically coupled to the second read domain node;
a read port comprising stacked first and second read transistors, the first read transistor having a source electrically coupled to the read bit line, a drain electrically coupled to a source of the second read transistor, and a gate electrically coupled to the read word line, the second read transistor having a drain electrically coupled to ground and a gate electrically coupled to the second node of the static memory cell; and
a sense transistor having a gate electrically coupled to the third read domain node, a source electrically coupled to the read bit line and a drain electrically coupled to a fourth read domain node for reading data stored in the memory cell.

11. The dual port register file of claim 10 wherein the write domain, the read domain and a domain of the memory cell reference voltage are isolated power domains and are independent of one another.

12. The dual port register file of claim 10 wherein the write domain, the read domain and a domain of the memory cell reference voltage are capable of being selectively switched off.

13. The dual port register file of claim 10 wherein a reference voltage of the write domain, a reference voltage of the read domain and the memory cell reference voltage are different.

14. The dual port register file of claim 10 wherein a clock frequency of the write domain and a clock frequency of the read domain are different.

15. A method comprising:
supplying, by a memory cell domain, a reference voltage of a memory cell to a memory cell reference voltage node, the memory cell reference voltage node being electrically coupled to two cross-coupled inverters of the memory cell;
supplying, by a write domain, a write domain reference voltage to at least one of a first write domain node or a second write domain node, the first write domain node being electrically coupled to a write bit line of the memory cell and the second write domain node being electrically coupled to a complementary write bit line of the memory cell;
in response to supplying the reference voltage of the memory cell and supplying the write domain reference voltage, causing data to be stored in the memory cell; and
reading the data from the memory cell by at least:
supplying, by a read domain, a read domain reference voltage to a first read domain node and a second read domain node, the first read domain node being electrically coupled to a read word line and the second read domain node being electrically coupled to a read bit line, the read word line being electrically coupled to a read port comprising stacked first and second read transistors, the first read transistor having a source electrically coupled to the read bit line, a drain electrically coupled to a source of the second read transistor, and a gate electrically coupled to the read word line, the second read transistor having a drain electrically coupled to ground and a gate electrically coupled to a node of the static memory cell; and
sensing a voltage level at a fourth read domain node, the fourth read domain node being electrically coupled to a drain of a sense transistor, the sense transistor having a gate electrically coupled to a third read domain node and a source electrically coupled to the read bit line; and
wherein the memory cell domain, the write domain and the read domain are isolated power domains.

16. The method of claim 15 wherein a first node of the memory cell is electrically coupled to an input node of a second inverter of the two inverters and an output node of the a first inverter of the two inverters and the second node of the memory cell is electrically coupled to an input node of the first inverter and an output node of the second inverter, and a power supply node of the first inverter and the second inverter is electrically coupled to the memory cell reference voltage node.

17. The method of claim 16 wherein a first write access transistor has a source electrically coupled to the first node, a drain electrically coupled to the write bit line and a gate electrically coupled to a write word line and a second write access transistor has a source electrically coupled to the second node, a drain electrically coupled to the complementary write bit line and a gate electrically coupled to the write word line.

18. The method of claim 15, further comprising:
   determining that the data stored in the memory cell is a logical one if the reference voltage of the read domain is sensed at the fourth read domain node.

19. The method of claim 15, further comprising:
   determining that the data stored in the memory cell is a logical zero if a ground voltage is sensed at the fourth read domain node.

20. The method of claim 15 wherein the write domain, the read domain and the memory cell domain are capable of being selectively switched off.

\* \* \* \* \*